United States Patent [19]
Nakata

[11] 4,009,482
[45] Feb. 22, 1977

[54] SEMICONDUCTOR THERMALLY SENSITIVE SWITCH STRUCTURE

[75] Inventor: Josuke Nakata, Itami, Japan

[73] Assignee: Mitsubishi Denki Kabushiki Kaisha, Tokyo, Japan

[22] Filed: Aug. 12, 1976

[21] Appl. No.: 713,872

Related U.S. Application Data

[63] Continuation of Ser. No. 506,772, Sept. 17, 1974, abandoned.

[30] Foreign Application Priority Data

Sept. 26, 1973 Japan ............... 48-108107

[52] U.S. Cl. .................... 357/28; 357/38; 165/135; 338/22 SD; 338/24

[51] Int. Cl.² .............. H01L 23/56; H01L 29/66; H01L 29/74; B22D 1/00

[58] Field of Search .......... 338/22 SD, 23, 24; 357/28, 81, 38, 45; 165/135

[56] References Cited

UNITED STATES PATENTS

| | | | |
|---|---|---|---|
| 3,343,004 | 9/1967 | Ovshinsky | 357/28 |
| 3,391,728 | 7/1968 | Kelly | 357/28 |
| 3,417,397 | 12/1968 | List et al. | 357/28 |
| 3,491,596 | 1/1970 | Dean | 357/28 |
| 3,600,650 | 8/1971 | Obenhaus | 357/28 |
| 3,614,480 | 10/1971 | Berglund | 357/38 |
| 3,699,403 | 10/1972 | Boleky | 357/45 |
| 3,806,759 | 4/1974 | Kabaservice | 357/38 |

Primary Examiner—Andrew J. James
Attorney, Agent, or Firm—Wenderoth, Lind & Ponack

[57] ABSTRACT

A thermally sensitive semiconductor switch structure has a nichrome strip vacuum evaporated and sintered in a zigzag pattern on a ceramic substrate and a silicon pellet disposed on the substrate through the nichrome strip and a glass layer. A thyristor is provided in the silicon pellet and is electrically insulated from the nichrome strip. The thyristor is adapted to be heated by a current flowing through the nichrome strip and to be turned on upon its reaching a predetermined temperature. When its temperature decreases below the predetermined magnitude, it is turned off.

7 Claims, 6 Drawing Figures

SEMICONDUCTOR THERMALLY SENSITIVE SWITCH STRUCTURE

This application is a continuation of application Ser. No. 506,772 filed Sept. 17, 1974 and now abandoned.

BACKGROUND OF THE INVENTION

This invention relates to a semiconductor thermally sensitive switch structure utilizing a thyristor.

In order to switch thyristors from their OFF to their ON state, there have been previously employed various means. For example, (1) an overvoltage or an OFF-state voltage having an excessive rate of rise has been applied across the main electrode of thyristors as in semiconductor diode switches, semiconductor symmetrical switches etc.; (2) a gate trigger current has been supplied to the gate electrode of thyristors as in the usual triode thyristors; (3) semiconductor pellets of thyristors have been irradiated with light as in photosensitive thyristors; (4) semiconductor pellets have been pressurized to increase the leakage current resulting from the strain thereon, thereby to turn the thyristors on as in pressure sensitive thyristors; and (5) thyristors have been put in an electric field to increase the surface conductance thereby to turn them on with an increased leakage current as in field effect thyristors. Among these means, the means (1), (2) and (3) have been most frequently employed for practical purposes.

What is common to those known manners is to use thyristors to maintain the junction temperature of the thyristor equal to or less than the prescribed magnitude thereof so as to prevent the OFF-state voltage ability or the breakover voltage and the circuit commutated turn-off time thereof from decreasing below the prescribed magnitudes thereof. In other words, if the junction temperature of thyristors exceeds the prescribed magnitude thereof then the breakover voltage is decreased so as to break the thyristors over with the particular applied voltage. This leads to a danger that thyristors and circuits in which they are connected have the excessively high current flowing therethrough resulting in destruction. Also, with the circuit commutated turn-off time exceeding the prescribed magnitude thereof, the commutation fails to be effected. This results in the flow of extraordinary current through associated circuits which is accompanied by the destruction or disablement of the thyristors and associated utilization devices.

SUMMARY OF THE INVENTION

It is accordingly an object of the invention to provide a quite novel type of thermally sensitive switch by effectively and positively utilizing the break-over phenomenon resulting from the thermal function previously regarded as being dangerous for conventional thyristors.

The present invention accomplishes this object by the provision of a semiconductor thermally sensitive switch structure comprising a semiconductor switch element including at least four semiconductor layers of alternate conductivity, and heater means for heating the semiconductor switch element to switch the latter from its non-conducting state to its conducting state, the heater means being electrically insulated from the semiconductor switch element.

Preferably, the semiconductor switch element and the heater means may be disposed on one surface of a substrate of electrically insulating material and have an electrically insulating layer interposed therebetween and applied to the substantial area of the one surface of the substrate.

BRIEF DESCRIPTION OF THE DRAWINGS

The present invention will become more readily apparent from the following detailed description taken in conjunction with the accompanying drawings in which:

FIG. 1b is an equivalent electrical circuit for the thermally sensitive thyristor shown in FIG. 1a;

FIG. 2b is a graph illustrating the relationship between the breakover voltage and the junction temperature for the thermally sensitive thyristor shown in FIG. 1a;

FIG. 3b is a sectional view taken along the line IIIb—IIIb of FIG. 3a.

DESCRIPTION OF THE PREFERRED EMBODIMENTS

The present invention is based upon the phenomenon that thyristors are broken over at a junction temperature at which the voltage applied thereacross is higher than the break-over voltage. The term "semiconductor thermally sensitive switch element" used in the specification and in the claims is generic to a "Thermally sensitive thyristor".

Like conventional thyristors, thermally sensitive thyristors have a pnpn or npnp four layer structure including a pair of main electrodes disposed in ohmic contact with a pair of the outermost layers forming emitter regions and a gate electrode disposed in ohmic contact with at least one intermediate layer.

Figure 1A:
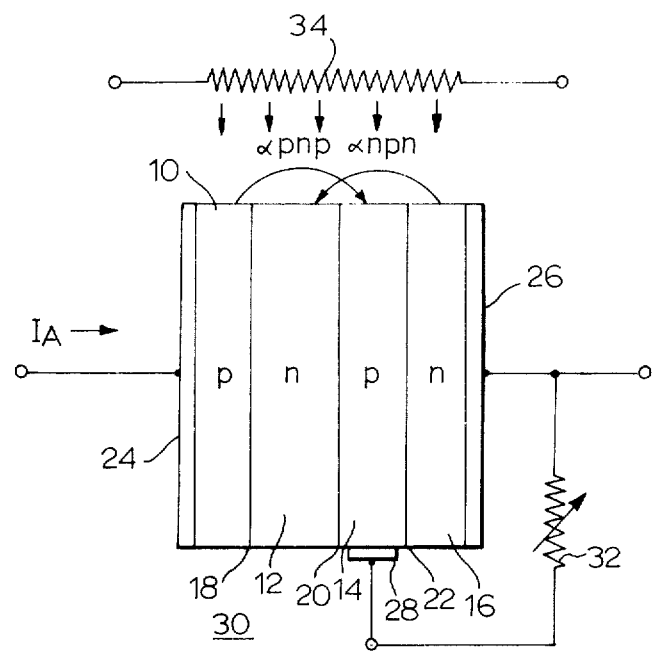
FIG. 1a is a schematic diagram of a typical structure of a thermally sensitive thyristor constructed in accordance with the principles of the present invention.

FIG. 1a shows a typical structure of a thermally sensitive thyristor. The arrangement illustrated comprises a p type first emitter layer 10, an n type first base layer 12, a p type second base layer 14 and an n type second emitter layer 16 superposed on one another in the named order to form a first, a second and a third pn junction 18, 20 and 22 respectively therebetween. An anode electrode 24 is disposed in ohmic contact with the first emitter layer 10, a cathode electrode 26 is disposed in ohmic contact with the second emitter layer 16, and a gate electrode 28 is disposed in ohmic contact with the second base layer 14. The thermally sensitive thyristor thus formed is generally designated by the reference numeral 30. A variable resistor 32 is connected across the cathode and gate electrodes 26 and 28 respectively for a purpose as will be apparent hereinafter. A heat source may be disposed adjacent the thermally sensitive thyristor 15 so as to be thermally coupled thereto. In the latter event, the thyristor is of the indirectly heated type. The heat source is shown in FIG. 1a as being an electrically heated resistor 34.

Figure 1B:
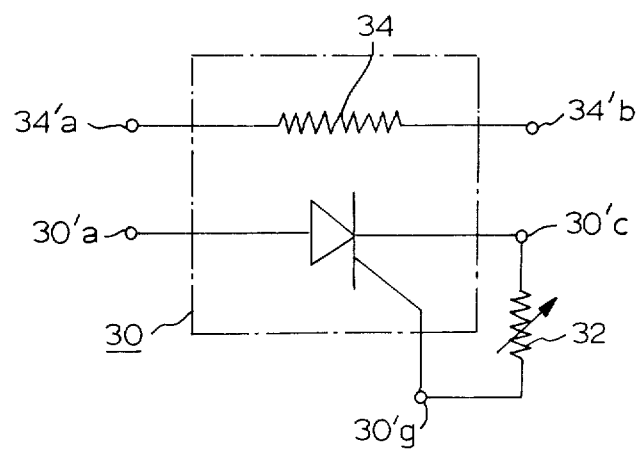

The indirectly heated type thermally sensitive thyristor 30 may be represented by an electrical equivalent circuit as shown in FIG. 1b wherein like reference numerals designate the components identical to those shown in FIG. 1a.

The thermally sensitive thyristor may have a structure including five layers of alternate conductivity or a pnpnp or an npnpn five layer structure. It is possible to switch such thyristors in both the forward and reverse directions.

Figure 2A:
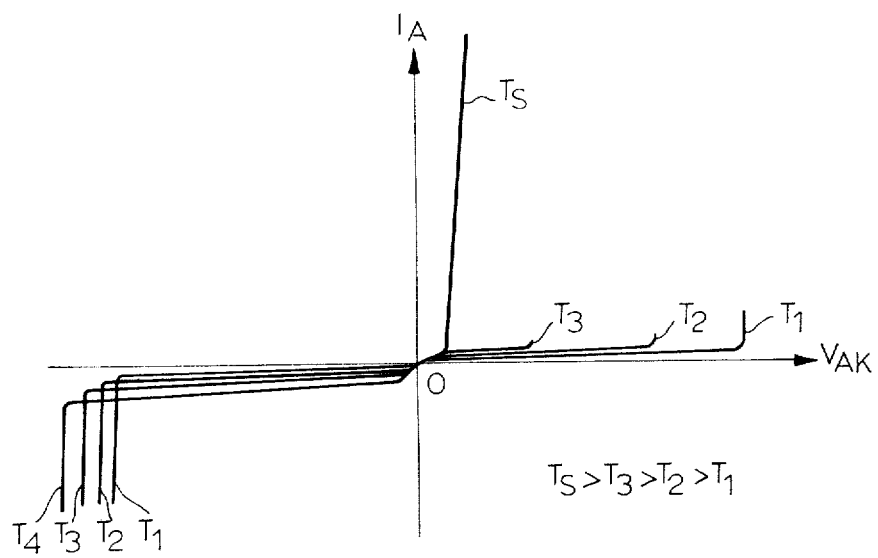
FIG. 2a is a graph illustrating the anode-to-cathode voltage-current characteristic of the thermally sensitive thyristor shown in FIG. 1a with the junction temperature being the parameter.

Thermally sensitive thyristors such as shown in FIG. 1a have the anode-to-cathode voltage-current characteristic as shown in FIG. 2a. In FIG. 2a wherein a principal current $I_A$ (see FIG. 1a) flowing through the anode and cathode electrodes 24 and 26 respectively is plotted on the ordinate against a voltage $V_{AK}$ across those electrodes on the abscissa, the voltage-to-current characteristics are illustrated for a thermally sensitive thyristor having a junction temperature $T_j$ successively raised to $T_1$, $T_2$, $T_3$, and $T_s$ where $T_1 < T_2 < T_3 < T_s$.

As shown on the first quadrant in FIG. 2a, the thermally sensitive thyristor has a forward voltage-to-current characteristic including a stable ON state and a stable OFF state as long as the junction temperature thereof is sufficiently low. The term "forward" means that the anode electrode has a higher potential than the cathode electrode. In the OFF state an extremely low leakage current is permitted only to flow through the thyristor until a voltage applied thereacross reaches a certain limit. If a voltage applied across the thyristor exceeds a threshold voltage thereof then the so-called breakover phenomenon occurs by which the thyristor switches from its OFF to its ON state. This threshold voltage is called the breakover voltage or the ability to block a forward voltage.

In the ON state, however, the thermally sensitive thyristor has a very low impedance and is responsive to a slight voltage applied thereacross to cause a flow of heavy current therethrough. That voltage is called an ON-state voltage and that current is called an ON-state current. Once the thyristor has been transferred to its ON state, the ON state is maintained and the OFF state is not restored unless the ON-state current decreases to a certain magnitude. A minimum current for maintaining the ON state is called a "holding current".

If a voltage is applied in the reverse direction (in which the cathode electrode has a higher potential than the anode electrode) thereacross then the thermally sensitive thyristor exhibits the reverse voltage-to-current characteristic such as shown on the third quadrant in FIG. 2a. That characteristic permits only a slight leakage current to flow in the reverse direction through the thyristor until a limited voltage is reached to break it down, and resembles the reverse voltage-to-current characteristic exhibited by reverse blocking thyristors and semiconductor rectifier diodes. That limited voltage is called a reverse breakdown voltage. If the reverse breakdown voltage exceeds a certain limit then the thermally sensitive thyristor may be thermally destroyed.

The transfer of thermally sensitive thyristor from its OFF to its ON state as above described is accomplished by means for heating the thyristor to raise its temperature.

From FIG. 2a it is seen that the thermally sensitive thyristor has its breakover voltage decreased with an increase in its junction temperature.

However, the breakover phenomenon does not occur in thermally sensitive thyristors at temperatures exceeding a certain limit. That is, when put at such temperatures, thermally sensitive thyristors exhibit the voltage-to-current characteristic not including the OFF state at all. This voltage-to-current characteristic includes the ON state alone and has the same curve as the forward characteristic of pn junction diodes. A minimum junction temperature at which the OFF state is not developed is called herein a switching temperature designated by $T_s$ in FIG. 2b.

Figure 2B:
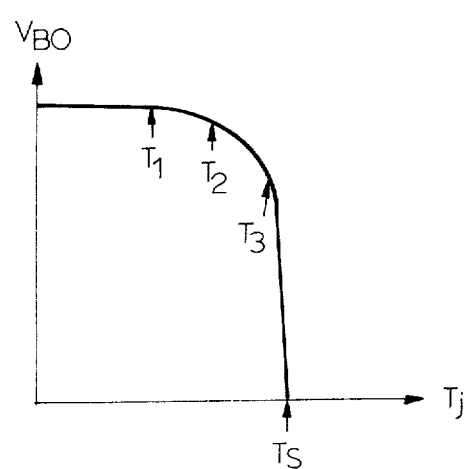

FIG. 2b shows the breakover voltage $V_{BO}$ plotted on the ordinate against the junction temperature $T_j$ for a typical thermally sensitive thyristor and therefore the junction temperature-dependence of the breakover voltage. Junction temperatures $T_1$, $T_2$, $T_3$ and $T_s$ shown in FIG. 2b correspond to the $T_1$, $T_2$, $T_3$ and $T_s$ illustrated in FIG. 2a. As shown in FIG. 2b, the breakover voltage is initiated and decreases at the time $T_1$ and suddenly drops at temperatures above $T_3$ until the OFF state disappears at the switching temperature of $T_s$.

The junction temperature-dependency of the breakover voltage of thermally sensitive thyristors is variable with the magnitude of resistance connected across the cathode and gate electrodes thereof. More specifically, with the parallel resistance infinitely high or with the gate electrode in its open state, the particular thermally sensitive thyristor has a characteristic switching temperature as determined by the type of semiconductive material forming the thyristor and the junction structure. As the resistance decreases, the switching temperature becomes higher than that characteristic value. Therefore a variable resistor such as shown at 32 in FIG. 1a connected across a gate and a cathode electrode of the particular thermally sensitive thyristor can vary the magnitude of resistance to adjust the switching temperature thereof. As an example, the switching temperature is possible to be adjusted between about 75° and 175° C for a thermally sensitive thyristor formed of silicon.

It is recalled that, upon the switching temperature being reached, thermally sensitive thyristors have a forward voltage-to-principal current characteristic such that the OFF state disappears while only the ON state appears.

That state in which only the ON state is present occurs due to the fact that a leakage current (or an OFF-state current) through the pnpn junction structure is considerably increased through the formation of thermal which, in turn, cooperates with an increase in the lifetime of the carriers to increase current amplification factors $\alpha pnp$ and $\alpha npn$ of the pnp and npn transistor portions (see FIG. 1a) until the sum of the $\alpha pnp$ and $\alpha npn$ is equal to or greater than unity. From this it will be appreciated that the characteristic switching temperature of thermally sensitive thyristors greatly depends upon the relationship between the temperature and leakage current, between the temperature and current amplification factor and between the current and current amplification factor. Accordingly thermally sensitive thyristors can be manufactured by properly selecting the type of semiconductive material, the lifetime of the carriers, the impurity concentration, the impurity distribution, the thickness of individual semiconductor layers etc. in view of the required switching temperature.

In order to return thermally sensitive thyristors from their ON state back to their OFF or to turn them off, it is required to return the junction temperature back to a temperature less than the switching temperature while returning the ON state current back to a current less than the holding current. It is noted that the holding current substantially approximates a null value adjacent the switching temperature.

Thus thermally sensitive thyristors may be called combined temperature sensor and switch elements utilizing the pnpn junction structure. As compared with thermistors previously employed as thermally sensitive elements, such thyristors have a pnpn junction structure which has a very high impedance in its OFF state and very low impedance in its ON state. Moreover the semiconductor pellet used is required only to be thin and to have a small area with respect to the required current capacity. This results in the advantage that a thermally sensitive switch having a small thermal time constant can readily be provided. Also thermally sensitive thyristors are superior to thermistors in that uniform characteristics can easily be obtained consistently and the secular change can be very small as in conventional thyristors and transistors.

The present invention provides thermally sensitive switch structures including the thermally sensitive thyristor such as above described having operatively coupled thereto heater means, and adapted to switch the thermally sensitive thyristor by having the heater means heat it due to a current flowing therethrough.

Referring now to FIG. 3, there is illustrated a semiconductor thermally sensitive switch structure of the indirectly heated type constructed in accordance with the principles of the present invention. The semiconductor thermally sensitive switch structure is generally designated by the reference numeral 100 and comprises a substrate 40 of any suitable electrically insulating ceramic, a length of heating nichrome wire 34 folded into a predetermined pattern, in this example, into a zigzag pattern upon one surface of the substrate 40 and a silicon pellet for forming a thermally sensitive thyristor 30 also disposed on the one surface of the substrate 40 over the heating wire 34 and an electrically insulating glass layer 42 interposed therebetween. Then electrodes of the heating wire 34 and the thermally sensitive thyristor 30 are connected to respective leads to an external circuit.

Figure 3A:
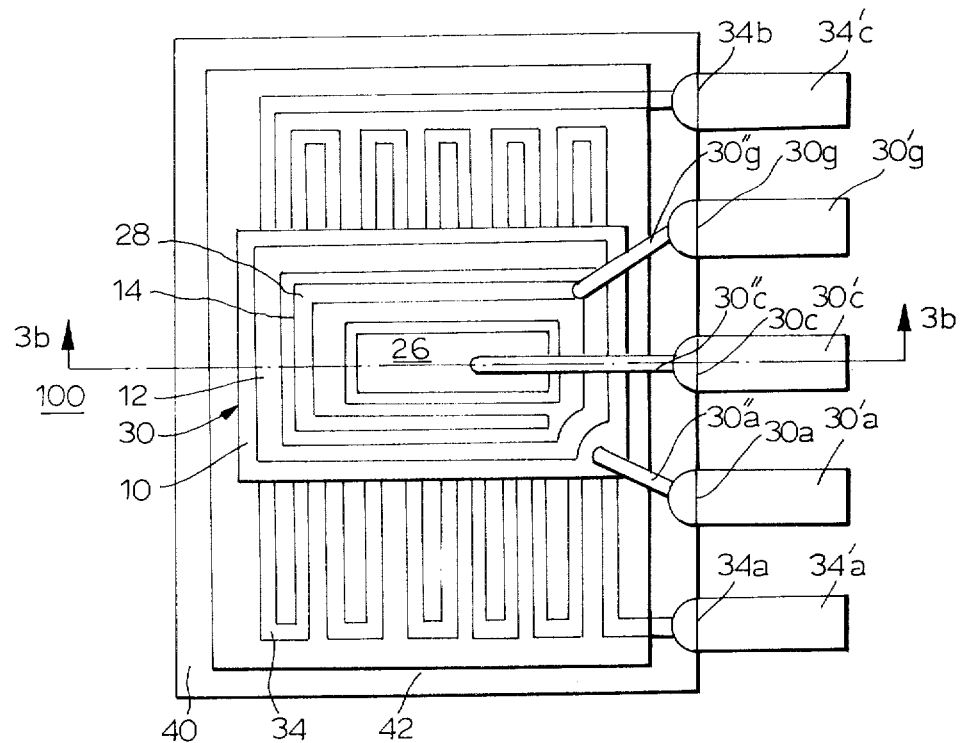
FIG. 3a is a plan view of a thermally sensitive thyristor constructed in accordance with the principles of the present invention.

In the example illustrated, the substrate 40 is in the form of a rectangular plate 1 mm thick, 4 mm long and 6 mm wide. As best shown in FIG. 3a, the substrate 40 is provided on one edge portion of the one surface thereof with a plurality, in this case, five of spaced bonding pads 30a, 30c, 30g, and 34a and 34b by a metallizing technique well known in the art for the purpose as will be apparent hereinafter.

The substrate 40 may be formed of an electrically insulating material selected from the group consisting of ceramics, glass, sapphire, berya porcelains etc. approximating in coefficient of thermal expansion silicon or any other semiconductive material covered with a coating of any suitable electrically insulating material such as silicon dioxide, silicon nitride or the like.

Then nichrome, that is an alloy including 80 percent by weight of nickel (Ni) and 20 percent by weight of chromium (Cr), is vacuum evaporated into a predetermined pattern, in this case into a zigzag pattern, on that surface of the substrate 40 having the bonding pads disposed thereon. Then the evaporated nichrome is annealed into the length of heating wire 34 fixed on the said surface of the substrate 40 to the form heater means. Thus the heater means 34 is formed of a stripshaped evaporated film in a zigzag pattern having a desired magnitude of resistance and having the two ends terminating at the two outermost bonding pads 34a and 34b.

The heater means may be formed of any suitable electrically resisting material other than nichrome. Preferred examples of an electrically resisting material include, in addition to nichrome, metals such as tungsten, tantalum and chromium, and metal oxides, for example, tin oxide ($SnO_2$). Alternatively, the heater means may be a semiconductive material such as silicon or germanium, or a thermistor, or a semiconductor element including a pn junction.

After the heater means 34 has been formed as above described, the bonding pads 30a, 30c, 30g, 34a and 34b are connected to respective external leads 30'a, 30'c, 30'g, 34'a and 34'b.

Then an electrically insulating layer 34 made of glass is disposed on the surface including the heater means 34 of the substrate 40. The purpose of the glass layer 42 is to prevent a shortcircuit of the heating wire 34 and electrically insulating the silicon pellet for forming the thermally sensitive thyristor 30 from the heater means 34 by sticking to the pellet. The insulating layer 42 is formed of glass having a coefficient of thermal expansion approximately the same as that of the silicon pellet and the ceramic forming the substrate 40. Boro-silicate glass is preferable for this purpose. The glass layer 42 may be disposed on the substrate 40 by applying the substrate in the form of a powder of such a glass and firing it to a thickness ranging from 1 to 20 microns.

On the other hand, in order to form the thermally sensitive thyristor 30, a silicon pellet is preliminarily prepared which is about 0.2 mm thick, 1.5 mm long and 2.0 mm wide for the substrate 40 having the dimension as above specified and a pnpn four layer structure with electrodes has been formed therein in a manner well known in the art.

Figure 3B:
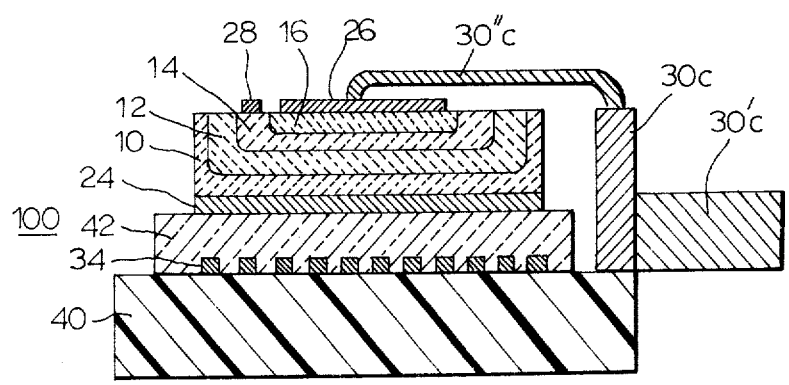

For example, a p type impurity may be diffused into an n type silicon wafer to form a pnp three layer structure in the well known manner. Then an n type impurity is diffused into a predetermined region of one surface of the wafer to form a pnpn four layer structure. Thereafter aluminum is vacuum-evaporated on the outermost emitter layers and on a predetermined region of one of intermediate layers of a p type base layer to form electrodes in ohmic contact therewith respectively to complete the thermally sensitive thyristor 30. The thermally sensitive thyristor thus formed is best shown in FIG. 3b as having a pnpn four layer structure including four semiconductor layers of alternate conductivity, that is, a p type emitter layer 10, an n type base layer 12, a p type base layer 14 and an n type emitter layer 16 and three pn junctions therebetween. Also an anode electrode 24 is disposed in ohmic contact with the p type emitter layer 10, a cathode electrode 26 is disposed in ohmic contact with the n type emitter layer 16 and a gate electrode 28 is disposed in ohmic contact with the p type base layer 14.

The silicon pellet thus processed is centrally positioned on the one surface of the substrate 40 included in the insulating glass layer 42 and attached to the glass layer 42. The attaching of the silicon pellet of the thermally sensitive thyristor 30 to the glass layer 42 is accomplished by fusing the aluminum forming the anode electrode 24.

After the silicon pellet of the thermally sensitive thyristor 30 has been fixed to the insulating glass layer 42, the individual electrodes are connected to the associated bonding pads through leads respectively. As best shown in FIG. 3a, the anode electrode 24 is connected to the bonding pad 30a by an internal lead 30"a, and the cathode electrode 26 is connected to the bonding pad 30c by an internal lead 30"c. Similarly, the gate electrode 28 is connected to the bonding pad 30g by an internal lead 30"g.

In this way the indirectly-heated, semiconductor thermally sensitive switch structure 100 is completed.

Then a variable resistor such as shown by the reference numeral 32 in FIG. 1 can be connected across the external leads 30'g and 30'c connected to the gate and cathode electrodes 28 and 26 of the thyristor 30 respectively in order to control the switching temperature of the thyristor 30 as previously described. If desired, a fixed resistor (not shown) may be connected across those external leads to set the switching temperature to a predetermined magnitude.

In FIG. 1b the external leads are designated by like reference numerals employed to identify them in FIG. 3. For example, the reference numeral 30'g designates the external lead 30'g.

In order to prevent the sturcture 100 from deteriorating in performance due to moisture, that surface of the insulating substrate 40 having the silicon pellet of the thermally sensitive thyristor 30 disposed thereon can be covered with any suitable electrically insulating material such as glass for hermetic sealing.

The present invention has several advantages. For example, the present switch structure is small-sized. Also the thermally sensitive thyristor itself is smaller in size than conventional thermally sensitive elements such as thermistors and has good thermal conductivity. Therefore by disposing the heater means in the proximity of the thyristor, the latter can be caused to undergo a rapid rise in temperature with a low electric power to perform a fast switching operation. Further since the thermally sensitive thyristor is electrically insulated from the heater means, the resulting switch circuit can be electrically isolated from a control circuit therefor.

The present invention is characterized in that no contact is used and the turn-on is always effected with a null voltage. Thus the present invention can be expected to have a variety of applications. For example, the present switch structure may be switched in response to a rise of ambient temperature by disposing the same in a place where a rise of temperature is expected while the the associated heater has flowing therethrough either no current or a little current to slightly preheat the thermally sensitive thyristor. Also it may be used to switch a utilization circuit in response to the effective value (or an RMS value) of a current sensed by the thermally sensitive thyristor. This is because the thermally sensitive thyristor is operative due to the effective value of a current flowing through the heater which is a characteristic feature previously not provided.

While the present invention has been described in conjunction with a few preferred embodiments thereof it is to understood that numerous changes and modifications may be resorted to without departing from the spirit and scope of the present invention. For example, the heater means may be disposed upon the semiconductor pellet of the thermally sensitive thyristor through the electrically insulating layer, with the thyristor disposed directly on the insulating substrate. Alternatively, the heater means may be remote from the semiconductor pellet for the thermally sensitive thyristor such as by attaching the heater means to a supporting plate for the pellet having a suitable heat capacity. This measure causes heat from the heater means to be transferred to the thyristor with a time delay thereby to temporarily delay a rise of temperature of the thyristor. With such a construction, the device becomes a time delay switch. In order to control the switching temperature of the thermally sensitive thyristor, the gate electrode may be, if desired, disposed in ohmic contact with each of the intermediate or base layers of the thyristor and connected to the emitter electrode through an individual resistor either fixed or variable.

What is claimed is:

1. A semiconductor thermally sensitive switch structure comprising a thermally sensitive semiconductor switch element including at least four semiconductor layers of alternate conductivity and having p-n junctions between said layers and which element can change between stable conducting and nonconducting states at a switching temperature and which is self-held in the nonnconducting state, electrode means on said switch element for connecting said switch element in an electrical circuit for switching the current flow in the circuit, and heater means on said switch element for heating said semiconductor switch element to switch the latter from its nonconducting state to its conducting state, said heater means being electrically insulated from said semiconductor switch element.

2. A semiconductor thermally sensitive switch structure as claimed in claim 1 further comprising a common substrate of electrically insulating material on which said semiconductor switch element and said heater means are disposed.

3. A semiconductor thermally sensitive switch structure as claimed in claim 1 wherein said electrode means comprises an electrode on at least one intermediate layer, and an electrode on one outermost layer and further comprising a resistor, said electrodes being connected through said resistor thereby to control a switching temperature thereof.

4. A semiconductor thermally sensitive switch structure as claimed in claim 3 wherein said resistor is a variable resistor.

5. A semiconductor thermally sensitive switch structure comprising a substrate of electrically insulating material, heater means fixedly secured to one surface of said substrate, an electrically insulating layer disposed on the one surface of said substrate including said heater means, and a semiconductor switch element disposed on said electrically insulating layer in electrically insulated relationship with said heater means, and a semiconductor switch element disposed on said electrically insulating layer in electrically insulated relationship with said heater means, said semiconductor switch element including at least four thermally sensitive semiconductor layers of alternate conductivity and having pn junctions between said layers and which elements can change between stable conducting and nonconducting states at a switching temperature and which is self-held in the nonconducting state, and electrode means on said switch element for connecting said switch element in an electrical circuit for switching the current flow in said circuit, said switch element being heated by said heater means to switch from its nonconducting state to its conducting state.

6. A semiconductor thermally sensitive switch structure as claimed in claim 5 wherein said electrically insulating layer is of boro-silicate glass.

7. A semiconductor thermally sensitive switch structure comprising a substrate of electrically insulating material, a semiconductor switch element disposed on said substrate, said semiconductor switch element including at least four thermally sensitive semiconductor layers of alternate conductivity and having pn junctions between said layers and which element can change between stable conducting and nonconducting states at a switching temperature and which is self-held in the nonconducting state, and electrode means on said switch element for connecting said switch element in an electrical circuit for switching the current flow in said circuit, said switch element heater means disposed on said semiconductor switch element and an electrically insulating layer between said switch element and said heater means, said heater means heating said semiconductor switch element to switch the latter from its nonconducting state to its conducting state.

* * * * *